United States Patent [19]

Ayasli et al.

[11] Patent Number: 5,012,123
[45] Date of Patent: Apr. 30, 1991

[54] HIGH-POWER RF SWITCHING SYSTEM

[75] Inventors: Yalcin Ayasli, Lexington; Peter J. Katzin, Arlington, both of Mass.

[73] Assignee: Hittite Microwave, Inc., Woburn, Mass.

[21] Appl. No.: 330,114

[22] Filed: Mar. 29, 1989

[51] Int. Cl.$^5$ .............................................. H03K 17/10
[52] U.S. Cl. .................................... 307/112; 307/571
[58] Field of Search ........................ 307/248, 570-573, 307/581-585, 497, 296.3, 296.4, 296.5, 98-100, 112, 113, 116, 254; 330/277, 300; 331/62, 74, 75, 108 R, 116 FE, 117 FE

[56] References Cited

U.S. PATENT DOCUMENTS

| | | | |
|---|---|---|---|
| 4,367,421 | 1/1983 | Baker | 307/570 |
| 4,394,590 | 7/1983 | Honda | 307/584 |
| 4,487,458 | 12/1984 | Janutka | 307/577 |
| 4,686,387 | 8/1987 | Rumelhard | 307/571 X |
| 4,751,408 | 6/1988 | Rambert | 307/571 |
| 4,788,511 | 11/1988 | Schindler | 330/277 |

Primary Examiner—A. D. Pellinen
Assistant Examiner—David Osborn
Attorney, Agent, or Firm—Joseph S. Iandiorio

[57] ABSTRACT

A switching system for controlling rf energy through an rf transmission medium including a plurality of semiconductor switching devices connected in a series configuration with the primary electrodes connected in series, and means for providing graduated bias on the control electrodes for establishing an equal control voltage on each device between its control electrode and one of its primary electrodes.

14 Claims, 3 Drawing Sheets

HIGH-POWER RF SWITCHING SYSTEM

FIELD OF THE INVENTION

This invention relates to an rf switching system and more particularly to such a system in which a number of semiconductor switching devices are employed to greatly increase the switchable power.

BACKGROUND OF INVENTION

There are many applications in which it is desirable to carry as much power as possible in an rf transmission line or medium. However, if switching must be performed, the maximum power may be limited by the power-handling capacity of the switching devices.

Typically, transistors connected in shunt or series with the line are used to switch rf power. This provides the necessary switching speed for rf systems. However, transistors and other switching devices inherently have a maximum voltage handling capacity, regardless of their size. Thus, the transmission line voltage is limited by the switch characteristics. Since the rf transmission line power is proportional to the square of the voltage, the voltage limitations of the switching devices severely limit the amount of rf power which can be handled.

RF power could theoretically be increased by decreasing impedance; however, rf line impedance is typically set to standard values, for example, 50 ohms in a microwave line. Thus, decreasing transmission line impedance to increase power would create a hybrid circuit to which additional components would have to be added to make it compatible with standard circuitry. In addition, the larger lines required to accomplish low impedance transmission would make high-speed switching difficult to accomplish.

By employing a number of parallel switching devices, more current can be switched. However, if more current is transmitted, the line voltage must be increased proportionally to keep the impedance at the desired (50 ohm) level. Thus, maximum rf power is still limited by the maximum voltage that can be handled by the switches. As a result, to date the monolithic or discrete-transistor switching devices commonly used in rf circuits have kept the maximum transmittable power levels relatively low.

SUMMARY OF INVENTION

It is therefore an object of this invention to provide an rf switching system which allows a dramatic increase in the amount of transmittable power.

It is a further object of this invention to provide an rf switching system which can switch a relatively high voltage.

It is a further object of this invention to provide a high-power rf switching system which can employ either discrete or monolithic transistors as switching elements.

This invention results from the realization that rf switching systems can be dramatically improved by employing a plurality of synchronously switched series-connected transistors to greatly increase the voltage-handling capacity of the switching system to accomplish switching of a large amount of power in a standard rf transmission medium.

This invention features a switching system for controlling rf energy through an rf transmission medium. The switching system includes a plurality of semiconductor switching devices with the primary electrodes connected in series, and means for providing a graduated bias on the control electrodes of the switching devices to establish an equal control voltage on each device between its control electrode and one of its primary electrodes to increase the voltage capacity of the switching system and the power capacity of the transmission medium.

Preferably, the semiconductor switching devices are field effect transistors and the graduated bias is provided to their gates. In a preferred embodiment, the switching devices are identical series-connected FETs, which may be connected in series or shunt with the transmission medium. The graduated bias may be provided by a voltage divider network. The voltage divider network preferably includes a plurality of resistors, which may be in combination with a plurality of series-connected inductors, connected in series with the control electrodes of the semiconductor devices.

The switching system may further include a ground return connected between the transmission medium and ground. The ground return may include a plurality of series-connected resistors connected in parallel with the semiconductor switching devices. The semiconductor switching devices may be connected between the transmission medium and ground, or may be connected in series with the transmission medium.

The switching system may further include means for compensating for the parasitic capacitance of the semiconductor devices. This may be accomplished with a plurality of series-connected capacitors connected across the primary electrodes of the semiconductor switching devices.

The means for providing a graduated bias may apply a bias which increases proportionally from the transistor connected to ground to the transistor connected to the transmission medium. The proportional bias increase may be an arithmetic increase for equalizing the control electrode primary potential of a plurality of identical switching devices. In an alternative preferred embodiment, the means for providing a graduated bias includes a second plurality of semiconductor switching devices with their primary electrodes connected in series. The second plurality of switching devices is connected between a control potential source and the control electrodes of the plurality of semiconductor switching devices. Further included may be a voltage divider circuit including a resistor network connected between a second control potential source and the control electrodes of the second plurality of semiconductor switching devices for providing a graduated bias to the second switching devices.

DISCLOSURE OF PREFERRED EMBODIMENTS

Other objects, features, and advantages will occur to those skilled in the art from the following description of a preferred embodiment and the accompanying drawings, in which.

Figure 1A:
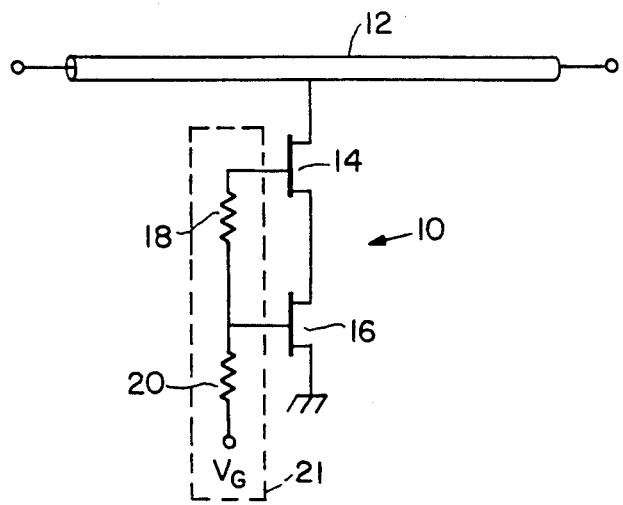
FIG. 1A is a schematic diagram of a high-power rf switching system according to this invention.
Figure 4:
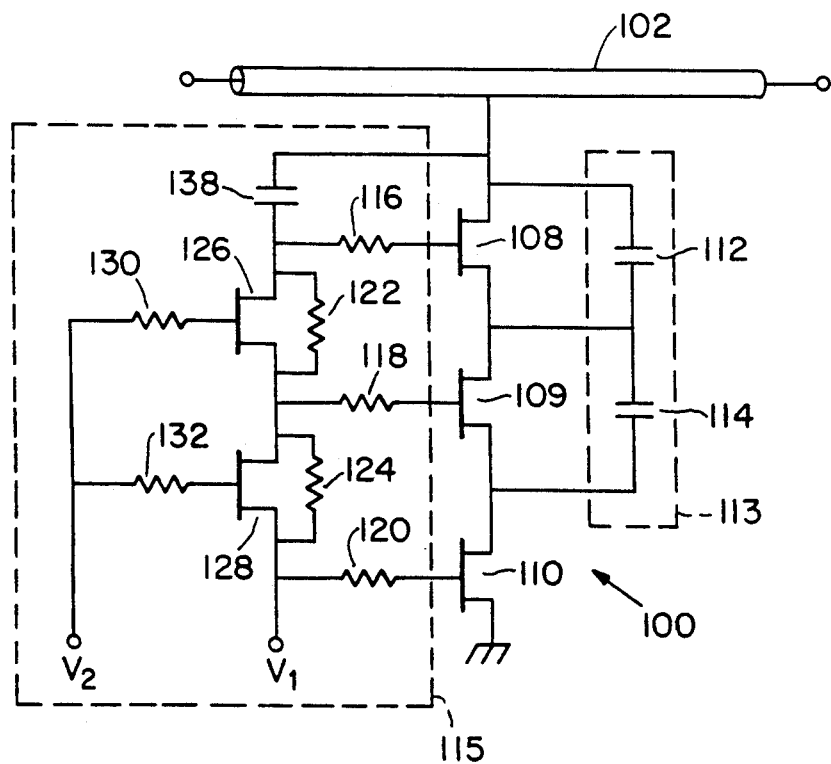

FIGS. 3A-F illustrate the potential variations over one period at selected points in the circuit of FIG. 1A; and FIG. 4 is a schematic diagram of an rf switching system according to this invention including circuitry for compensation of stray ground plane capacitance and for increasing switching speed and lowering rf loss in the system.

This invention may be accomplished in a switching system for controlling rf energy through an rf transmission medium. The system includes a plurality of semiconductor switching devices connected in a series configuration with their primary electrodes connected in series. The switching system further includes means for providing a graduated bias on the control electrodes of the semiconductor switching devices to establish an equal control voltage on each device between its control electrode and one of its primary electrodes. The equal control voltage switches the devices simultaneously, which allows the series of semiconductor switching devices to switch a relatively high voltage to allow the rf transmission medium to handle a great amount of power.

There is shown in FIG. 1A switching system 10 for controlling rf energy through transmission medium 12. Switching system 10 includes identical FETs 14 and 16 connected in series between transmission medium 12 and ground. Bias-supply network 21 includes resistors 18 and 20 and voltage source $V_G$. Bias supply 21 provides a graduated bias on the gates of FETs 14 and 16 to establish an equal control voltage between the gate of each device and one of its primary electrodes.

An example of an FET which can be used in embodiment of FIG. 1A would be a one millimeter periphery gallium arsenide transistor with a resistance of approximately 2 ohms and a breakdown voltage of approximately 12 volts. By series connecting two such devices 14 and 16, up to 24 volts can be switched. The increased voltage-handling capability of the rf switching system allows a concurrent increase in the amount of power that can be handled on transmission medium 12. Bias-supply network 21 may include 0.5 to $-9$ volt DC source $V_G$ which is more fully explained below in conjunction with FIG. 3, and resistors 18 and 20 which may be approximately 2000 ohms and 1000 ohms, respectively, for providing a bias on the base of FET 14 twice as large as that on the base of FET 16 as is also more fully explained below.

Figure 1B:
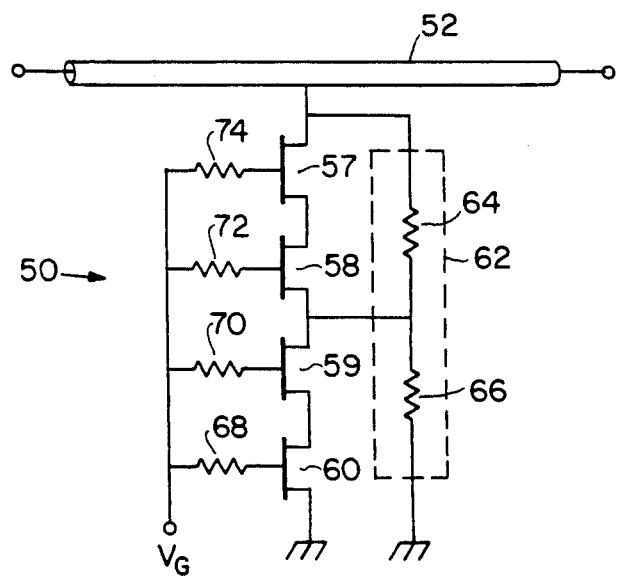
FIG. 1B is a schematic diagram of an alternative rf switching system according to this invention which can handle twice the voltage of the system of FIG. 1A.

An alternative bias-supply network for a four-switch system according to this invention is shown in FIG. 1B. Semiconductor switching devices 57 through 60 are three terminal switches with their primary electrodes connected between transmission medium 52 and ground. Voltage source $V_G$ is connected through current-limiting semiconductor resistors 68, 70, 72 and 74 to the control electrodes of switching devices 60, 59, 58, 57 respectively. Ground return 62 includes series-connected resistors 64 and 66 connected between transmission medium 52 and ground, and also connected to the midpoint of the four-switch switching system. Ground return 62 provides DC continuity to allow the voltage in medium 52 to be defined. Resistors 64 and 66 may each be 10,000 ohm resistors. For a typical FET such as described above in conjunction with FIG. 1A, four-FET switching system 50 allows up to 48 volts to be switched. A typical value for the bias-supply resistors 68, 70, 72 and 74 may be 8,000 ohms.

By using current-limiting or saturating semiconductor resistors as bias-supply resistors 68, 70, 72 and 74, it is possible to increase switching speed and equalize the transition times between the low and high impedance states. If regular linear or non-saturating resistors are used for the gate bias network, the transition time from the on to the off state of the switch is much larger than from the off to the on state. This unequal transition time is due to the gate junction capacitances of FETs 57-60; the capacitance in the off state is much smaller than that in the on state. When the FETs are in the off state, a large RF voltage swing will appear across gate bias resistors 68, 70, 72 and 74, driving them into saturation. This increases the effective resistances of the gate bias resistors to values that are several time larger than when the FETs are in the on state. Thus, the product of the effective values of the saturating gate bias resistors and the gate junction capacitances of the FETs remains relatively constant for both the on and off states of the switch. As a result, the transition time from the on to the off state is shortened to become very close to that from the off to the on state.

Figure 1C:
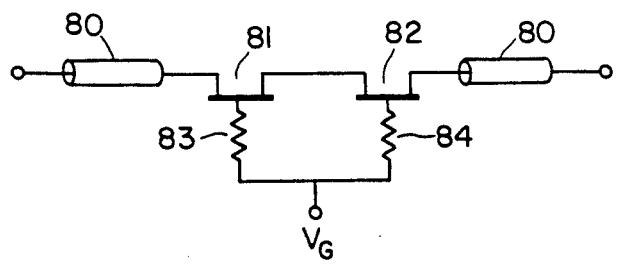
FIG. 1C is a schematic diagram of an alternative to the system of FIG. 1A for a series-connected switching system according to this invention.

FIG. 1C illustrates a series-connected two switch switching system according to this invention. The principal of operation is identical to that of the shunt configuration. FETs 81 and 82 are connected in series with transmission medium 80. Gate bias control is accomplished with voltage source $V_G$ and identical bias supply resistors 83 and 84, which maybe 4000 ohm resistors.

Figure 1D:
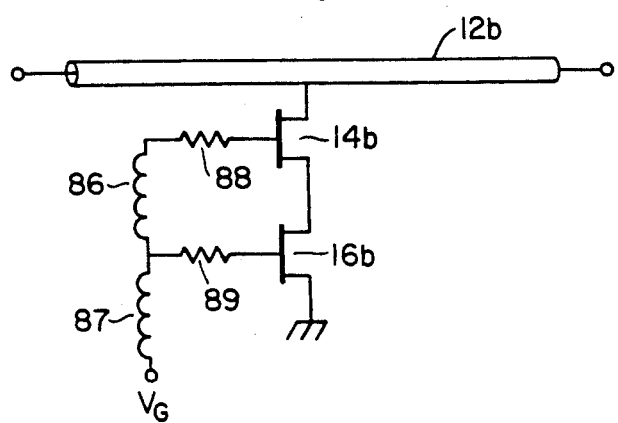
FIG. 1D is a schematic diagram of another alternative to the system of FIG. 1A which provides faster switching speed and lower insertion loss by using inductors in the bias network.

FIG. 1D shows another alternative bias-supply network for a two-switch system. Semiconductor switching devices 14b and 16b are three terminal switches with their primary electrodes connected between transmission medium 12b and ground. Voltage source $V_G$ is connected through inductors 86 and 87, and resistors 88 and 89, to the control electrodes of switching devices 14b and 16b, respectively.

Inductors 86 and 87 form a potential divider that provides a graduated distribution of the rf voltage swing across the control electrodes of switching devices 14b and 16b, in a similar fashion to the resistor bias network shown in FIG. 1A. Inductors 86 and 87 may be 30 nano-henrys and 15 nano-henrys, respectively. Resistors 88 and 89 prevent voltage overshoots from appearing at the control electrodes of devices 14b and 16b during the switching transients between the on and off states of the switch system. The same resistors can be used to equalize the switching times of the two devices 14b and 16b so that they will switch on and off at the same time. The value of resistors 88 and 89 may be 500 ohms and 600 ohms, respectively.

The advantages of the bias supply network of FIG. 1D are that it can provide faster switching speed and lower bias circuit loss than the bias network of FIGS. 1A, 1B or 1C.

Figure 2:
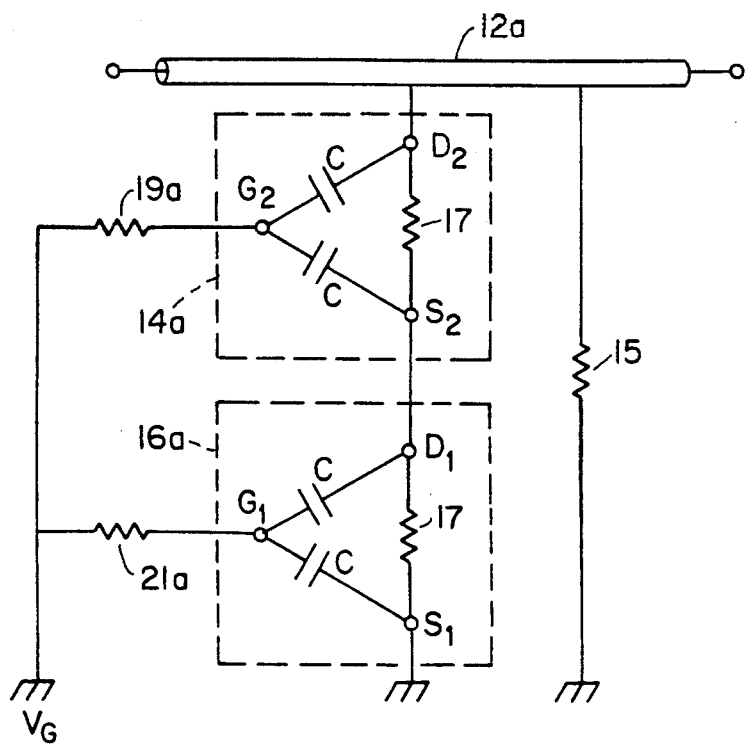
FIG. 2 is a schematic diagram illustrating an equivalent circuit for the FETs of FIG. 1A.

Equivalent circuits for the FETs of FIG. 1A in the low-impedance state in which no DC voltage is applied to the gate terminals are shown in FIG. 2. FETs 14a and 16a may be modeled as resistances 17 connected between drains D2 and D1 and sources S2 and S1, respectively. Connected between gates G2 and G1 and the drain and source of each FET is the electrical capacitance C. Resistors 19a and 21a have equal values to equalize the switch time constants for FETs 14a and 16a. Resistor 15 is a high-value resistor to be considered an open circuit to rf to provide a ground return.

When the FET is in the low impedance on state and the voltage in transmission medium 12a is at its positive peak value of, for example, 2 volts, the voltage at the junction of FETs 14a and 16a is half of this value or 1 volt. The voltage at $G_2$ is intermediate these values at 1.5 volts. The voltage at point $G_1$ is 0.5 volts. The positive bias of each gate-source junction will help fully open the drain-source channels.

During the negative half-cycle, the voltage at each point in FIG. 2 changes sign. Even though the gates are more negative than the sources, the drain-gate junctions are positively biased, and so the drain-source channels are still fully open.

Figure 3A:
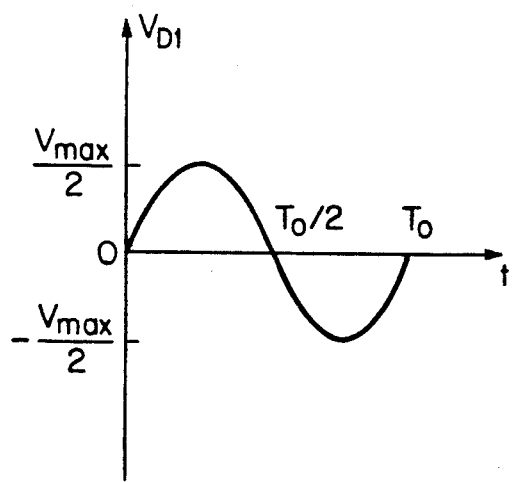
Figure 3B:
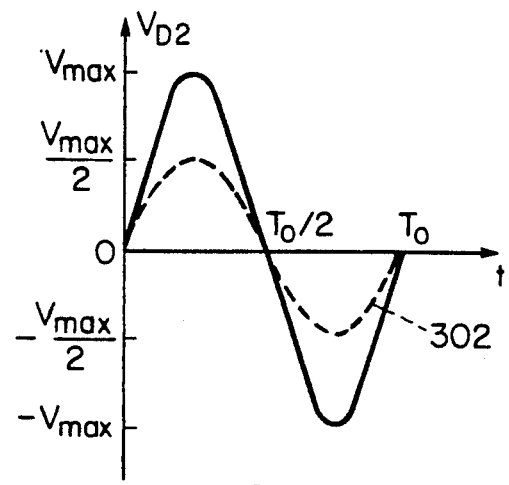

The potential variations over one period with respect to ground for the circuit of FIG. 2 in its high-impedance off state are shown in FIGS. 3A through 3F. The rf voltage in transmission medium 12a is assumed to vary between plus and minus $V_{max}$ over a time $T_0$. This voltage appears at point $D_2$, the drain of FET 14a, as shown in FIG. 3B. Gates $G_2$ and $G_1$ are biased from DC bias source $-V_G$ indicated by line 304, FIG. 3C. Voltage at drain $D_1$ of FET 16a is shown in FIG. 3A. The voltage at point $D_1$ is the same as that at point $S_2$, FIG. 3F.

Figure 3C:
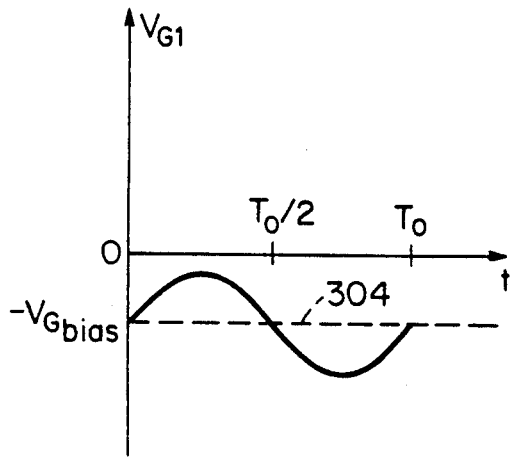
Figure 3D:
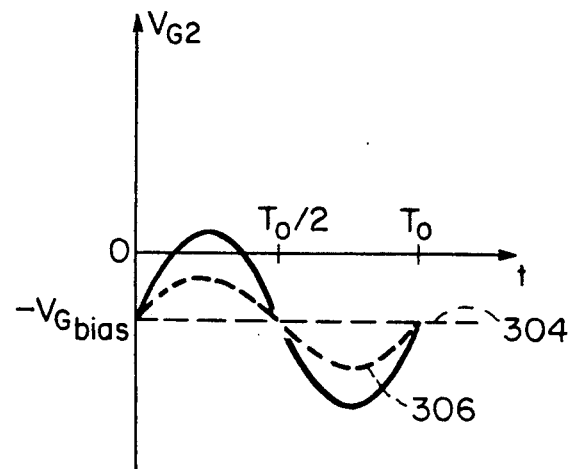
Figure 3E:
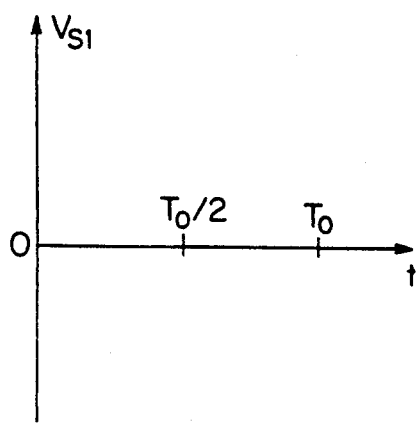
Figure 3F:
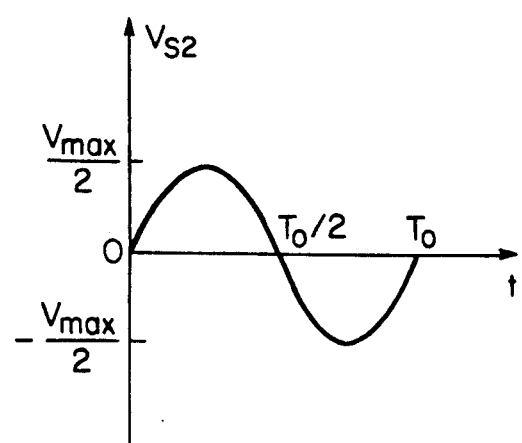

As shown in FIG. 3D, the voltage on the gate of FET 14a goes into the positive region. However, the voltage is positive with respect to ground and not with respect to source terminal $S_2$, FIG. 3F. The gate-source bias on FET 14a is shown with respect to the source voltage $V_{S2}$ by curve 306, FIG. 3D. Curve 302, FIG. 3B, illustrates the drain-source bias on FET 14a with respect to source voltage $V_{S2}$.

The voltage at the gate of FET 16a is depicted in FIG. 3C. FET 16a has its source at ground so its gate voltage is the same as the gate-source bias. Also, the drain-source bias is equivalent to the drain voltage shown in FIG. 3A.

As can be seen by comparing FIG. 3A with curve 302 and FIG. 3C with curve 306, the drain-source and gate-source bias on FETs 14a and 16a are equal throughout the entire cycle. As a result, the FETs act in unison. Since each FET can handle a maximum drain-to-source voltage of the transistor breakdown voltage minus its pinchoff voltage, the two FETs in series can handle twice that voltage. As a result, the maximum power switching capability of the switching device is increased by a factor of four. By combining any number of switching devices in this manner, virtually any amount of rf power can be switched. Thus, the switching device does not limit the amount of power in the rf transmission medium.

Circuitry which may be added to the basic switching system of FIGS. 1A, 1B, 1C and 1D to compensate for stray ground plane capacitance, to increase switching speed, and to lower rf loss is shown in FIG. 4. Capacitance compensation circuit 113 includes capacitors 112 and 114 in parallel with FETs 108 and 109. Without circuit 113, the parasitic capacitance between the drain and source FET terminals and the ground plane can result in an uneven voltage swing across each FET 108 through 110 when they are in the off state. This parasitic capacitance may lead to breakdown currents flowing through the FETs, which would cause higher off-state losses. Circuit 113 equalizes the voltage across FETs 108-110 to minimize off-state losses.

In the embodiment of FIG. 4, capacitor 112 connected across the drain and source terminals of FET 108 would preferably have a value of 3 times the parasitic capacitance of approximately 0.1 picofarads, or 0.3 picofarads. Capacitor 114 connected across the drain and source terminals of FET 109 would have the same value as the effective parasitic capacitance, or 0.1 picofarads.

Although the switching system of FIG. 4 includes three FETs 108 through 110, as has been described the switching system according to this invention may include two or more semiconductor switching devices. For a switching system with M FETs, and an effective parasitic capacitance between the ground plane and each FET of $C_p$, the capacitance of the stray ground plane capacitance compensation capacitors such as capacitors 112 and 114 may be calculated as follows:

$$N\text{th Capacitor} = \frac{(M - N)(M - N + 1)}{2} C_p$$

Where N equals 1 for the FET connected to the transmission medium and N equals M for the FET with its source at ground.

FIG. 4 also illustrates a circuit 115 for increasing the switching speed and lowering the rf loss when the switch 100 is in the off state for the switching system according to this invention. FETs 126 and 128 may each be 0.15 mm gate periphery GaAs FETs that get turned on only during the switching transients. Control voltage $V_1$ sets the gate potentials on switching FETs 108 through 110 through the drain-source channels of FETs 126 and 128. Switching FETs 108-110 may be the same as described in conjunction with FIG. 1A. Gate-biasing resistors 120, 118 and 116 supply the graduated bias to FETs 110, 109 and 108 respectively. Resistors 120, 118 and 116 may be 1000 ohms each.

Between switching transients, FETs 126 and 128 are switched off to create a very high impedance between the gates of FETs 126 and 128 and ground. This results in a lower rf loss. Resistors 130 and 132 are used along with DC source $V_2$ to bias FETs 126 and 128. These resistors are typically much larger than the resistances employed to bias the gates of the FETs of the switching system without circuit 115. For example, resistances 130 and 132 may be 7,000 ohms.

By employing driver FETs 126 and 128 of increased size, the switching speed of FETs 108 through 110 in switching system 100 can be increased several times for the same rf loss that would otherwise be present in the circuit. In addition, the off-state rf loss of the resistor bias network of FIG. 1A is greatly reduced by employing driver circuit 115, FIG. 4. Resistors 122 and 124 provide a ground return that prevents the off-state gate leakage current in switching FETs 108 and 109 from switching those FETs to the on state. Resistors 122 and 124 may each be approximately 20,000 ohms. Capacitor 138 compensates for the parasitic capacitances of FETs 126 and 128, and may have a capacitance of 0.08 picofarads.

Control voltages $V_1$ and $V_2$ preferably operate as follows. With $V_1$ at 0 volts, source $V_2$ is also at 0 volts and the FETs are switched on. To switch FETs 108 through 110 off, a bias voltage $-V_{off}$ is applied at $V_1$ and a bias voltage of $-V_{off}$ is applied at $V_2$. After a suitable delay to allow FETs 108 through 110 to switch off, $V_2$ is then biased with a potential of two times $-V_{off}$ to switch FETs 126 and 128 off to prevent over-heating of these FETs due to the large saturated channel current flow.

Although the invention has been illustrated with two to four switching devices, as one skilled in the art would appreciate, any number of series-connected switching devices may be employed to switch virtually any voltage, so that the rf switching system does not limit the amount of power in the RF transmission medium.

Although specific features of the invention are shown in some drawings and not others, this is for convenience only as each feature may be combined with any or all of the other features in accordance with the invention.

Other embodiments will occur to those skilled in the art and are with the following claims:

What is claimed is:

1. A switching system for controlling rf energy through an rf transmission medium, comprising:
    a plurality of semiconductor switching devices connected in a series configuration with the primary electrodes connected in series;
    means for providing a graduated bias on the control electrodes of said devices to establish an equal control voltage on each device between its control electrode and one of its primary electrodes for increasing the voltage capacity of said switching system and the power capacity of said rf transmission medium;
    said means for providing a graduated bias including a voltage divider network connected across the control electrodes of said semiconductor devices; and
    said voltage divider network including a plurality of series-connected inductors.

2. The switching system of claim 1 further including a ground return connected between said transmission medium and ground.

3. The switching system of claim 2 in which said ground return is also connected to a primary electrode of at least one of said semiconductor devices.

4. The switching system of claim 2 in which said ground return includes a plurality of series-connected resistors connected in parallel with said semiconductor switching devices.

5. The switching system of claim 1 in which said semiconductor devices are field effect transistors.

6. The switching system of claim 5 in which the graduated bias is provided to the gates of said transistors.

7. The switching system of claim 1 in which said voltage divider network includes a plurality of resistors connected in series with the control electrodes of said semiconductor devices.

8. The switching system of claim 7 in which said are non-linear, saturating, semiconductor resistors.

9. The switching system of claim 1 in which said semiconductor switching devices are connected between said transmission medium and ground.

10. The switching system of claim 1 further including means for compensating for the parasitic capacitance of said semiconductor devices.

11. The switching system of claim 10 in which said means for compensating includes a plurality of series-connected capacitors connected across the primary electrodes of said semiconductor switching devices.

12. The switching system of claim 1 in which said means for providing a graduated bias includes a second plurality of semiconductor switching devices connected in a series configuration with the primary electrodes connected in series, said second plurality of semiconductor switching devices connected between a control electrode bias source and the control electrodes of the plurality of semiconductor switching devices;
    said means for providing a graduated bias further including a voltage divider circuit which includes a resistor network connected between a second control electrode bias source and the control electrodes of said second plurality of semiconductor devices.

13. A switching system for controlling rf energy through an rf transmission medium and increasing the allowable voltage in said medium comprising:
    a plurality of identical field effect transistors connected in a series configuration with the drains and sources connected in series to form a conductive path between the transmission medium and ground; and
    a bias network connected between a bias source and the gates of said transistors for biasing the gates to provide synchronous switching of said transistors to increase the voltage capacity of said switching system and the power-capacity of said transmission medium said bias network including a plurality of series-connected inductors.

14. The switching system of claim 13 in which said bias network provides an arithmetically increasing bias to the gates of said transistors.

* * * * *